(12) United States Patent
Lee et al.

(10) Patent No.: US 12,276,905 B2
(45) Date of Patent: Apr. 15, 2025

(54) BLANK MASK AND PHOTOMASK USING THE SAME

(71) Applicant: SK enpulse Co., Ltd., Pyeongtaek-si (KR)

(72) Inventors: GeonGon Lee, Seoul (KR); Inkyun Shin, Seoul (KR); Seong Yoon Kim, Seoul (KR); Suk Young Choi, Seoul (KR); Hyung-joo Lee, Seoul (KR); Sung Hoon Son, Seoul (KR); Min Gyo Jeong, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 571 days.

(21) Appl. No.: 17/749,387

(22) Filed: May 20, 2022

(65) Prior Publication Data

US 2022/0382141 A1 Dec. 1, 2022

(30) Foreign Application Priority Data

May 21, 2021 (KR) .......................... 10-2021-0065366

(51) Int. Cl.
*G03F 1/32* (2012.01)
*G03F 1/48* (2012.01)

(52) U.S. Cl.
CPC . *G03F 1/32* (2013.01); *G03F 1/48* (2013.01)

(58) Field of Classification Search
CPC ..................................... G03F 1/32; G03F 1/48
USPC ........................................................... 430/5
See application file for complete search history.

(56) References Cited

U.S. PATENT DOCUMENTS

| 8,841,058 | B2 | 9/2014 | Chang |
| 2016/0054650 | A1 | 2/2016 | Nam et al. |
| 2017/0023854 | A1 | 1/2017 | Nam et al. |

FOREIGN PATENT DOCUMENTS

| CN | 108663896 A | 10/2018 |
| CN | 106019817 B | 5/2020 |
| EP | 1 650 600 B1 | 11/2009 |
| JP | 2006-146151 A | 6/2006 |
| JP | 2011-81356 A | 4/2011 |
| JP | 2013-83933 A | 5/2013 |
| JP | 2016-45490 A | 4/2016 |
| JP | 2017-27006 A | 2/2017 |
| JP | 2019-90877 A | 6/2019 |
| JP | 2019-164383 A | 9/2019 |
| KR | 10-2008-0022893 A | 3/2008 |
| KR | 10-1207724 B | 11/2012 |
| KR | 10-2013-0132925 A | 12/2013 |
| KR | 10-1579843 B | 12/2015 |
| KR | 10-1584383 B | 1/2016 |
| KR | 10-2016-0135374 A | 11/2016 |
| KR | 10-2017-0043858 A | 4/2017 |
| KR | 10-2018-0032196 A | 3/2018 |
| KR | 10-2020-0008924 A | 1/2020 |
| KR | 10-2020-0056564 A | 5/2020 |
| TW | 202105058 A | 2/2021 |

*Primary Examiner* — Christopher G Young
(74) *Attorney, Agent, or Firm* — NSIP Law

(57) ABSTRACT

The present disclosure relates to a blank mask and the like, and comprises a transparent substrate and a light shielding film disposed on the transparent substrate. The light shielding film comprises a transition metal and at least any one between oxygen and nitrogen. The light shielding film comprises a first light shielding layer and a second light shielding layer disposed on the first light shielding layer. The light shielding film has an Rd value of Equation 1 below which is 0.4 to 0.8.

$$Rd = er_2/er_1 \quad \text{[Equation 1]}$$

In the Equation 1, the $er_1$ value is an etching rate of the first light shielding layer measured by etching with argon gas.
The $er_2$ value is an etching rate of the second light shielding layer measured by etching with argon gas.
In such a blank mask, a resolution degradation can be suppressed effectively when the light shielding film is patterned.

9 Claims, 6 Drawing Sheets

200

BLANK MASK AND PHOTOMASK USING THE SAME

CROSS-REFERENCE TO RELATED APPLICATIONS

This application claims the benefit under 35 USC 119(a) of Korean Patent Application No. 10-2021-0065366 filed on May 21, 2021, in the Korean Intellectual Property Office, the entire disclosure of which is incorporated herein by reference for all purposes.

BACKGROUND

1. Field

The present disclosure relates to a blank mask and a photomask using the same.

2. Description of Related Art

Due to high integration of semiconductor devices or the like, miniaturization of circuit patterns of semiconductor devices is being required. For this reason, importance of a lithography technique, which is a technique for developing a circuit pattern on a wafer surface using a photomask is being further emphasized.

For developing a miniaturized circuit pattern, a light source of exposure used in an exposure process (photolithography) is required to have a short wavelength. As the light source of exposure used recently, there is ArF excimer laser (wavelength of 193 nm) or the like.

Incidentally, there are Binary mask, Phase shift mask as photomasks.

The Binary mask has a structure in which a light shielding pattern layer is formed on a transparent substrate. In a surface where a pattern is formed from the Binary mask, a transmissive portion not including a light shielding layer allows exposure light to be transmitted, and a light shielding portion including a light shielding layer shields the exposure light. These can expose a pattern on resist film of the surface of a wafer. However, the Binary mask may cause a problem in the development of a minute pattern due to diffraction of light occurring at the edge of the transmissive portion as the pattern is being more miniatured.

As a phase shift mask, there are Levenson type, Outrigger type, and Half-tone type. Among the above, Half-tone type phase shift mask has a structure in which a semi-transmissive pattern film is formed on a transparent substrate. In a surface where a pattern is formed from the Half-tone type phase shift mask, a transmissive portion not including a semi-transmissive film allows exposure light to be transmitted, and a semi-transmissive portion including a semi-transmissive film allows exposure light to be attenuated. Attenuated exposure light is allowed to have a phase shift compared to exposure light which has transmitted the transmissive portion. Accordingly, diffraction light occurring at edges of the transmissive portion is counteracted by the exposure light which has transmitted the semi-transmissive portion, and thereby the phase shift mask can form a further refined minute pattern on a surface of a wafer.

SUMMARY

A blank mask according to one embodiment of the present disclosure includes a transparent substrate and a light shielding film disposed on the transparent substrate.

The light shielding film includes a transition metal and at least any one between oxygen and nitrogen.

The light shielding film includes a first light shielding layer and a second light shielding layer disposed on the first light shielding layer.

The light shielding film has a Rd value of Equation 1 below which is 0.4 to 0.8.

$$Rd = \frac{er_2}{er_1} \quad \text{[Equation 1]}$$

In the Equation 1, the $er_1$ value is an etching rate of the first light shielding layer measured by etching with argon gas.

The $er_2$ value is an etching rate of the second light shielding layer measured by etching with argon gas.

The $er_2$ value may be 0.4 to 0.5 Å/s.

The $er_1$ value may be 0.51 Å/s or more.

A Do value of Equation 2 below of the light shielding film may be less than 0.05.

$$Do = Bo - Po \quad \text{[Equation 2]}$$

In the Equation 2, the Bo value is an optical density of the light shielding film for a light with a wavelength of 193 nm.

When a light shielding pattern film formed by patterning the light shielding film is observed at an upper surface, the Po value is an optical density for a light with a wavelength of 193 nm of a measuring area corresponded to an area from an edge of the light shielding pattern film, to a position spaced apart by 4 mm from the edge in inner side direction of the light shielding pattern film.

The transition metal may include any one among Cr, Ta, Ti and Hf.

An etching rate measured with chlorine-based gas of the light shielding film may be 1.55 Å/s or more.

A blank mask according to another embodiment of the present disclosure includes a transparent substrate and a light shielding film disposed on the transparent substrate.

The light shielding film includes a transition metal and at least any one between oxygen and nitrogen.

The light shielding film includes a first light shielding layer and a second light shielding layer disposed on the first light shielding layer.

a pattern edge loss area measured by patterning the light shielding film is 10 nm$^2$ or less.

The pattern edge loss area is an area surrounded a first line, a second line, and a pattern edge profile of a patterned light shielding film when TEM (Transmission Electron Microscopy) image of the light shielding pattern film is observed.

The first line is an extended line which links a first point placed at a height of 20% on a side surface profile of the patterned light shielding film and a second point placed at the height of 40% on the side surface when an entire height of the patterned light shielding film is designated as 100%.

The second line is an extended line including a pattern film crossing point and disposed to be parallel to an upper boundary of the transparent substrate.

The pattern film crossing point is a spot where a pattern film center line and an upper surface profile of the light shielding pattern film meet.

The pattern film center line is an extended line passing through the pattern film center point which is the center point of a lower boundary of the light shielding pattern film and perpendicular to the upper boundary of the transparent substrate.

A photomask according to another embodiment of the present disclosure includes a transparent substrate and a light shielding pattern film disposed on the transparent substrate.

The light shielding pattern film includes a transition metal and at least any one between oxygen and nitrogen.

The light shielding pattern film includes a first light shielding layer and a second light shielding layer disposed on the first light shielding layer.

The light shielding pattern film has an Rd value of Equation 1 below which is 0.4 to 0.8.

$$Rd = \frac{er_2}{er_1} \quad \text{[Equation 1]}$$

In the Equation 1, the $er_1$ value is an etching rate of the first light shielding layer measured by etching with argon gas.

The $er_2$ value is an etching rate of the second light shielding layer measured by etching with argon gas.

When the light shielding pattern film is observed at the section, a pattern edge loss area of the light shielding pattern film may be 10 nm$^2$ or less.

A manufacturing method of a semiconductor element according to another embodiment of the present disclosure includes a preparing operation of disposing a light source, a photomask, and a semiconductor wafer where a resist film has been applied, an exposure operation of selectively transmitting a light incident from the light source on the semiconductor wafer through the photomask and a development operation of developing a pattern on the semiconductor wafer.

The photomask includes a transparent substrate and a light shielding pattern film disposed on the transparent substrate.

The light shielding pattern film includes a transition metal and at least any one between oxygen and nitrogen.

The light shielding pattern film includes a first light shielding layer and a second light shielding layer disposed on the first light shielding layer.

The Rd value of Equation 1 below of the light shielding pattern film is 0.4 to 0.8.

$$Rd = \frac{er_2}{er_1} \quad \text{[Equation 1]}$$

In the Equation 1, the $er_1$ value is an etching rate of the first light shielding layer 21 measured by etching with argon gas.

The $er_2$ value is an etching rate of the second light shielding layer measured by etching with argon gas.

DETAILED DESCRIPTION

Figure 1:
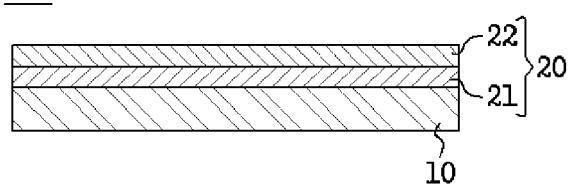
FIG. 1 is a conceptual view for illustrating a blank mask according to one embodiment disclosed in the present disclosure.

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein.

In this application, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this application, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this application, the description of "A and/or B" means "A, B, or A and B."

Throughout this application, terms such as "first", "second", "A", or "B" are used to distinguish the same terms from each other unless specially stated otherwise.

In this application, "B being placed on A" means that B is placed in direct contact with A or placed over A with another layer or structure interposed therebetween and thus should not be interpreted as being limited to B being placed in direct contact with A.

In this application, a singular form is contextually interpreted as including a plural form as well as a singular form unless specially stated otherwise.

In this application, room temperature refers to 20 to 25° C.

In this application, a surface profile of a light shielding pattern film means an outline of a light shielding pattern film observed in the section, when the section of the light shielding pattern film is observed by using TEM (Transmission Electron Microscopy) and the like.

In this application, a side surface profile of a light shielding pattern film means an outline of a side surface of a light shielding pattern film observed in the section, when a section of a light shielding pattern film is observed by using TEM (Transmission Electron Microscopy) and the like.

In this application, a pattern edge profile of a light shielding pattern film means an outline of an edge and the periphery of an upper boundary of a light shielding pattern film, when a section of the light shielding pattern film is observed by using TEM (Transmission Electron Microscopy) and the like.

Due to high integration of semiconductor devices, a further miniaturized circuit pattern is required to be formed on a semiconductor wafer. As a critical dimension (CD) of a pattern developed on a semiconductor wafer is further decreased, issues related to a resolution of a photomask is on an increasing trend.

A light shielding film comprised in a blank mask may be formed into a light shielding pattern film through etching or the like. The light shielding pattern film may be formed through etching when a resist pattern or another thin film pattern disposed on the light shielding film is applied as a mask, and an etching gas is applied as an etchant.

When the light shielding film is patterned in a dry etching method applied with an etching gas as an etchant, a light shielding pattern film formed through patterning may exhibit ununiform optical properties in the in-plane direction. In detail, the etching gas can etch a light shielding film along to the resist pattern or an etching mask toward the lower portion of the light shielding film from the surface of the light shielding film. In the etching process, within a side surface of the light shielding pattern film to be formed, an upper area of the side surface may be exposed to an etching gas for relatively long time compared to a lower area of the side surface. Due to this, etching exceeding the necessity thereof may occur in the in-plane direction of the light shielding film in the upper area. This may be one reason which degrades a resolution of a blank mask.

Inventors of the present disclosure verified that the degradation of the resolution of a blank mask can be effectively suppressed through the methods of introducing a multilayer structure to a light shielding film, allowing an upper layer of the light shielding layer to have a further durable structure compared to a lower layer, and the like, and thereby completed the present disclosure.

Hereinafter, the present disclosure will be described in detail.

FIG. 1 is a conceptual view for illustrating a blank mask according to one embodiment disclosed in the present application. With reference to the FIG. 1, the blank mask of the present disclosure is described.

A blank mask 100 comprises a transparent substrate 10 and a light shielding film 20 disposed on the transparent substrate 10.

The material of the transparent substrate 10 is not limited if a material has light transmission property with respect to an exposure light and can be applied to a blank mask 100. Specifically, a transmittance of the transparent substrate 10 with respect to an exposure light with the wavelength of 193 nm may be 85% or more. The transmittance may be 87% or more. The transmittance may be 99.99% or less. For example, the transparent substrate 10 may be applied by a synthetic quartz substrate. In such a case, the transparent substrate 10 can suppress attenuation of a light transmitting the transparent substrate 10.

In addition, a surface characteristic such as smoothness and roughness of the transparent substrate 10 can be adjusted to suppress optical distortion.

A light shielding film 20 may be disposed on the top side of the transparent substrate 10.

The light shielding film 20 may have a characteristic of shielding at least some of an exposure light incident to the bottom side of the transparent substrate 10. Additionally, a phase shift film 30 (refer to FIG. 5) and the like may be disposed between the transparent substrate 10 and the light shielding film 20. In such a case, the light shielding film 20 can be used as an etching mask in a process of etching the phase shift film 30 to have a pattern shape.

The light shielding film 20 comprises a transition metal and at least any one between oxygen and nitrogen.

The light shielding film 20 comprises a first light shielding layer 21 and a second light shielding layer 22 disposed on the first light shielding layer 21.

Density of Each Layer of Light Shielding Film

A light shielding film 20 has an Rd value of Equation 1 below which is 0.4 to 0.8.

$$Rd = \frac{er_2}{er_1} \qquad \text{[Equation 1]}$$

In the Equation 1, the $er_1$ value is an etching rate of the first light shielding layer 21 measured by etching with argon gas.

The $er_2$ value is an etching rate of the second light shielding layer 22 measured by etching with argon gas.

In a process of patterning a light shielding film 20, an upper side of a light shielding pattern film may be exposed to an etching gas for relatively long time compared to a lower side. Besides, within an upper area of a side surface of a patterned light shielding film, etching exceeding the necessity may occur in the in-plane direction of the light shielding film 20. Due to this, it may be difficult to the side surface of the light shielding pattern film be perpendicular to a surface of the transparent substrate 10.

To solving problems as the above, a method of controlling an etching rate of a second light shielding layer 22 to have a lower value compared to a first light shielding layer 21, by adjusting the amount of a transition metal of a second light shielding layer 22 to have a relatively larger value compared to a first light shielding layer 22. However, even though damage formed in the edge portion of the second light shielding layer 22 is decreased by applying such a method, because of the trend of being miniaturized in a critical dimension (CD) of a desired pattern, the decreased damage formed in the edge portion may still cause a problem related to the resolution of a photomask. In addition, when the amount of a transition metal comprised in the second light shielding layer 22 in consideration of only density control of the side surface profile of the light shielding pattern film, decrease of the etching rate of the light shielding film and defects caused from chrome (Cr) migration may occur. That is, there is a necessity of further elaborately controlling the side surface profile of the light shielding pattern film formed through a patterning process, by adjusting other characteristics such as the degree of density of each layer in addition to adjusting the composition amount by layer of the light shielding film.

Incidentally, an etching gas used in pattering of a light shielding film 20 carries chemical reaction with the light shielding film 20. Accordingly, an etching rate of each layer within the light shielding film 20 measured through the etching gas may be greatly affected by elements composed in each layer and reactivity with the etching gas. The inventors of the present disclosure found that an etching rate of each layer measured by the etching gas cannot directly reflect a density of the layer.

In contrast, the etching through argon gas corresponds to physical etching substantially not carrying chemical reaction with the light shielding film 20 as an etching target. Accordingly, the etching rate measured by etching with argon gas is thought to be a parameter which can be independent for the composition of each layer and chemical reactivity of each layer within the light shielding film 20 and can reflect effectively the degree of density of each layer within the light shielding film.

Accordingly, the inventors of the present disclosure ascertained that the side surface profile of the light shielding pattern film formed when the light shielding film 20 is patterned can be further elaborately controlled by controlling a Rd value than can reflect the degree of density of the first light shielding layer 21 and the second light shielding layer 22.

The $er_1$ value, $er_2$ value, and Rd value may be controlled depending on various factors. In detail, the values may be affected such as a density of a light shielding layer, a crystallization of metal elements, an amount of nonmetal elements, an arrangement of each composed element within the light shielding layer, and the like. Particularly, the values may be different depending on the process condition such as the rotation speed of a magnet when each layer within the light shielding film 20 is formed, a process condition of post processing such as cooling treatment after being formed, and the like. The detailed description of controlling means of Rd values are overlapped with the content as follows and thus omitted.

A method of measuring the Rd value of the light shielding film 20 is the same as below.

First, thicknesses of the first light shielding layer 21 and the second light shielding layer 22 are measured by using TEM (Transmission Electron Microscopy). A blank mask 100 as a measuring target is processed to be the size with a width of 15 mm and a length of 15 mm and thereby a sample is prepared. A surface of the sample is treated by FIB (Focussed Ion Beam), after that arranged in a TEM image measuring device, and a TEM image of the sample is measured. From the TEM image, the thicknesses of the first light shielding layer 21 and the second light shielding layer 22 are measured.

For example, the TEM image may be measured through JEM_2100F HR model available from JEOL LTD corporation.

Thereafter, the sample is etched with argon gas and etching times of the first light shielding layer 21 and the second light shielding layer 22 are measured. The sample is placed in XPS (X-ray Photoelectron Spectroscopy), and the area with a width of 4 mm and a length of 2 mm located in the center of the sample is etched with argon gas for measuring the etching time of each layer. When the etching time of each layer is measured, vacuum degree in a measuring device is applied to be $1.0*10^{-8}$ mbar, X-ray Source is applied to be Monochromator Al K α(1486.6 eV), anode electric power is applied to be 72 W, anode voltage is applied to be 12 kV, and a voltage of argon ion beam is applied to be 1 kV.

For example, XPS measuring device may be applied by K-Alpha model available from Thermo Scientific corporation.

The $er_1$ value, $er_2$ value, and Rd value are calculated from the thicknesses and etching rates of the measured first light shielding layer 21 and second light shielding layer 22.

The Rd value of the light shielding film 20 may be 0.4 to 0.8. The Rd value may be 0.5 to 0.77. The Rd value may be 0.6 to 0.8. The Rd value may be 0.6 to 0.7. In such a case, the side surface profile of the patterned light shielding film can be further elaborately controlled.

The $er_2$ value of the light shielding film 20 may be 0.4 to 0.5 Å/s. The $er_2$ value may be 0.4 to 0.47 Å/s. The $er_2$ value may be 0.42 to 0.45 Å/s. In such a case, the Rd value of the light shielding film 20 can be further easily controlled within a predetermined range in embodiments, and particle formation caused from redeposition of sputtering particles can be suppressed.

The $er_1$ value of the light shielding film 20 may be 0.4 to 0.5 Å/s. The $er_1$ value may be 0.55 Å/s or more. The $er_1$ value may be 0.6 Å/s or more. The $er_1$ value may be 1.0 Å/s or less. The $er_1$ value may be 0.8 Å/s or less. The $er_1$ value may be 0.7 Å/s or less. In such a case, the Rd value of the light shielding film can be further easily adjusted and simultaneously the etching of the light shielding film can be further efficiently performed.

Optical Properties of Light Shielding Film

A light shielding film 20 may be a Do value of Equation 2 below which is less than 0.05.

$$Do=Bo-Po \quad \text{[Equation 2]}$$

In the Equation 2, the Bo value is an optical density of the light shielding film 20 for a light with a wavelength of 193 nm.

Figure 3:
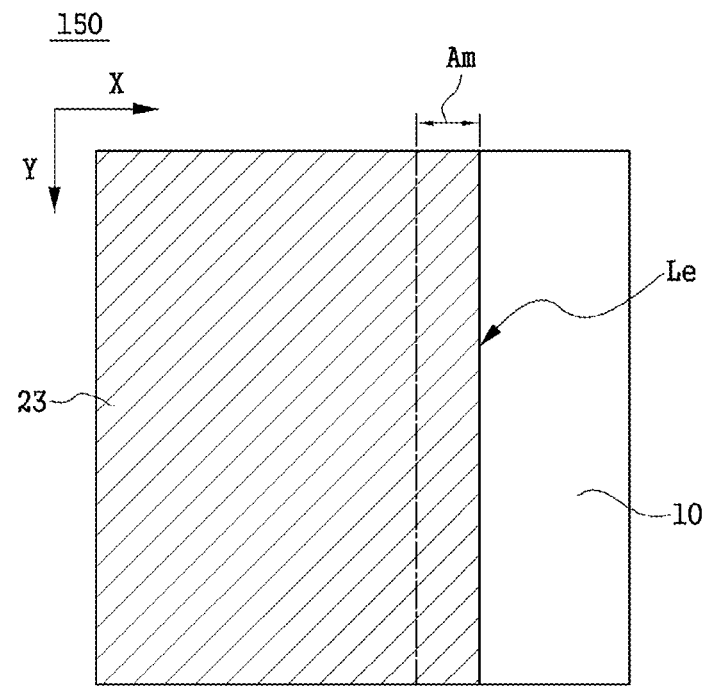
FIG. 3 is a ground plan observed at an upper surface for a light shielding pattern film formed by patterning a light shielding film according to another embodiment.

When a light shielding pattern film formed by patterning the light shielding film 20 is observed at an upper surface, the Po value is an optical density for a light with a wavelength of 193 nm of a measuring area corresponded to an area from an edge (Le) of the light shielding pattern film to a position spaced apart by 4 nm from the edge in inner side direction of the light shielding pattern film (refer to FIG. 3).

Figure 2:
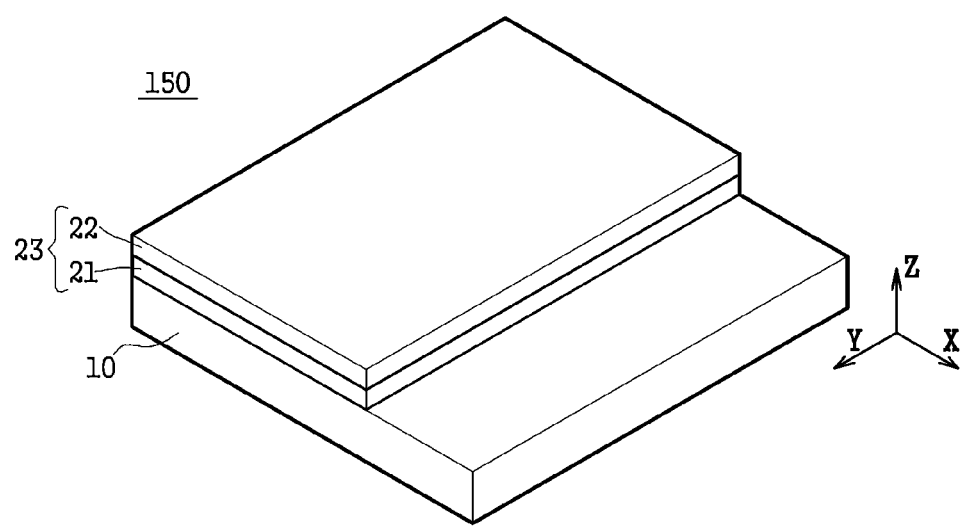
FIG. 2 is a conceptual view for illustrating a light shielding pattern film formed by patterning a light shielding film of a blank mask as a measuring target according to another embodiment.

FIG. 2 is a conceptual view for illustrating a light shielding patten film formed by patterning a light shielding film of a blank mask as a measuring target. Hereinafter, with reference to the FIG. 2, an embodiment will be described.

The light shielding pattern film 23 is formed by patterning a light shielding film. A side surface of the light shielding pattern film 23 (yz surface of the light shielding pattern film) is ordinarily formed through etching unless it is a surface of a blank mask itself. An upper side of the side surface formed through the etching (the side located in an upper position in z axis direction from the yz surface of the light shielding pattern film) is exposed to an etchant for a relatively long time, and more etching may be occurred compared to the lower side of the side surface. Due to this, portions adjacent to both ends of the light shielding pattern film 23 (the edge of the light shielding pattern film located in x axis direction) may be formed to have a relatively thinner thickness compared to the center portion of the light shielding pattern film 23. Due to this, a deviation in extinction characteristics in in-plane direction of the light shielding pattern film 23 may be high. The present disclosure can provide a blank mask by controlling Do value of the light shielding film and thereby the degradation of the resolution caused from patterning can be effectively suppressed.

For controlling the Do value of a light shielding film 20, it is required to control the durability of layers themselves comprised in the light shielding film, in addition to controlling other conditions of each layer within the light shielding film 20. Besides, the density may be affected by process condition during sputtering, condition of post processing such as a cooling operation after sputtering, and the like as well as the composition of the film. The description of the controlling mean is overlapped with the content below and thus the further description is omitted.

FIG. 3 is a ground plan observed at the upper surface for a light shielding pattern film formed by patterning a light shielding film. Hereinafter, with reference to the FIG. 3, an embodiment will be described.

Bo value is measured by irradiating an exposure light with a wavelength of 193 nm to a surface of the light shielding film before being patterned. When another thin film (a hard mask as an example) is formed on the light shielding film, the other thin film is removed through etching and after that the Bo value is measured. When another thin film formed on the light shielding film is removed, a difference value between a thickness of the light shielding film before being etched and a thickness of the light shielding film after being etched may be within 3 nm.

Subsequently, Po is measured in a light shielding pattern film 23 formed by patterning the light shielding film. When the light shielding pattern film 23 is observed at the upper surface, an area corresponded to an area from an edge of the light shielding pattern film, to a position spaced apart by 4 nm from an edge (Le) formed by patterning in inner direction of the light shielding pattern film is defined as a measuring area (Am) (refer to FIG. 3). For the measuring area (Am), an exposure light with a wavelength of 193 nm is irradiated to measure Po values.

Do value is calculated from the measure Bo value and Po value.

The Bo value and Po value may be measured by ellipsometer. The Bo value and Po value may be for example, measured by using MG Pro model available from Nano View corporation.

The Do value of the light shielding film 20 may be less than 0.05. The Do value may be 0.04 or less. The Do value may be 0.03 or less. The Do value may be 0.02 or less. The Do value may be 0.01 or more. In such a case, degradation of the resolution of a blank mask 100 caused from patterning of a light shielding film 20 may be effectively suppressed.

The Bo value of the light shielding film 20 may be 1.8 or more. The Bo value may be 1.85 or more. The Bo value may be 3 or less. In such a case, laminated thin films comprising a light shielding film 20 can effectively shield transmitting exposure light.

The Po value of the light shielding film 20 may be 1.8 or more. The Po value may be 1.82 or more. The Po value may be 3 or less. The Po value may be 2 or less. The Po value may be 1.9 or less. In such a case, it is possible to help suppressing the degradation of the resolution of a blank mask 100 effectively.

The transmittance of the light shielding film 20 for a light with a wavelength of 193 nm may be 1% or more. The transmittance may be 1.3% or more. The transmittance may be 1.4% or more. The transmittance may be 2% or less. In such a case, a thin film comprising a light shielding film 20 can effectively suppress the transmission of an exposure light.

Etching Characteristics of Light Shielding Film

An etching rate measured by etching with chlorine-based gas of the light shielding film 20 may be 1.55 Å/s or more.

For improving a resolution of a blank mask 100, a resist film or an etching mask film disposed on a light shielding film 20 may be required to be made into a thin film. When the light shielding film 20 is patterned, by controlling etching rate of the light shielding film 20 with respect to an etchant, it is possible to allow the light shielding film 20 to be patterned even though a resist film with a relatively thin thickness is formed on the light shielding film 20.

As an etchant of the light shielding film 20, chlorine-based gas may be comprised. The chlorine-based gas may comprise a chlorine gas ($Cl_2$) and oxygen gas ($O_2$).

An etching characteristics of the light shielding film 20 with respect to a chlorine-base gas may be controlled by controlling durability of layers comprised in the light shielding film 20, the distribution of the amount by element in the thickness direction of the light shielding film 20, the process condition when the light shielding film 20 is formed, the cooling rate after being formed into a film, and the like.

The method for measuring an etching rate of the light shielding film 20 with respect to chlorine-based gas is the same as below.

First, TEM image of the light shielding film 20 is taken to measure a thickness of the light shielding film 20. A blank mask 100 as a measuring target is processed to be a size with a width of 15 mm and a length of 15 mm and thereby a sample is prepared. A surface of the sample is treated by FIB (Focussed Ion Beam), after that disposed in a TEM image measuring device, and the TEM image of the sample is taken. A thickness of the light shielding film 20 is measured from the TEM image.

For example, the TEM image may be taken through JEM-2199F HR model available from JEOL LTD corporation.

Thereafter, an etching time of the light shielding film 20 measured by etching chlorine-based gas. The chlorine-based gas comprises chlorine gas of 90 to 95 volume %, oxygen gas of 5 to 10 volume %. The etching rate is calculated from the thickness of the light shielding film 20 and the etching time of the light shielding film 20.

The etching rate of the light shielding film 20 measured by etching with chlorine-based gas may be 1.55 Å/s or more. The etching rate may be 1.6 Å/s or more. The etching rate may be 1.7 Å/s or more. The etching rate may be 3 Å/s or less. In such a case, a resist film disposed on the light shielding film 20 may be made into a thin film and it can help suppressing the degradation of the resolution of a blank mask 100 effectively.

Pattern Edge Loss Area of Light Shielding Film

A blank mask according to another embodiment of the present disclosure comprises a transparent substrate and a light shielding film disposed on the transparent substrate.

The light shielding film comprises a transition metal and at least any one between oxygen and nitrogen.

The light shielding film comprises a first light shielding layer and a second light shielding layer disposed on the first light shielding layer.

A pattern edge loss area measured by patterning the light shielding film is 10 $nm^2$ or less.

The pattern edge loss area is an area surrounded by a first line, a second line, and a pattern edge profile of a patterned light shielding pattern film, when TEM (Transmission Electron Microscopy) image of the patterned light shielding pattern film is observed.

The first line is an extended line which links a first point placed at the height of 20% on a side surface profile of the patterned light shielding film and a second point placed at the height of 40% on the side surface profile when an entire height of the patterned light shielding film is designated as 100%.

The second line is an extended line comprising a pattern film crossing point and disposed to be parallel to an upper boundary of the transparent substrate.

The pattern film crossing point is a spot where a pattern film center line and an upper surface profile of the light shielding pattern film.

The pattern film center line is an extended line passing through the pattern film center point which is the center point of a lower boundary of the patterned light shielding film, and perpendicular to an upper boundary of the transparent substrate.

Through a resist pattern or an etching mask film disposed on the light shielding film 20, the light shielding film 20 can be etched. As a side surface profile of the light shielding pattern film formed after being etched is formed to be closer to be perpendicular with a surface of the transparent substrate 10, a resolution of a photomask 200 can be improved. Unless the side surface profile of the light shielding pattern film is elaborately controlled, the CD (critical dimension) deviation of a pattern developed on a semiconductor wafer may be larger.

The present disclosure can elaborately control the side profile of a light shielding pattern film formed when patterned, by adjusting the pattern edge loss area of the light shielding film 20.

Figure 4:
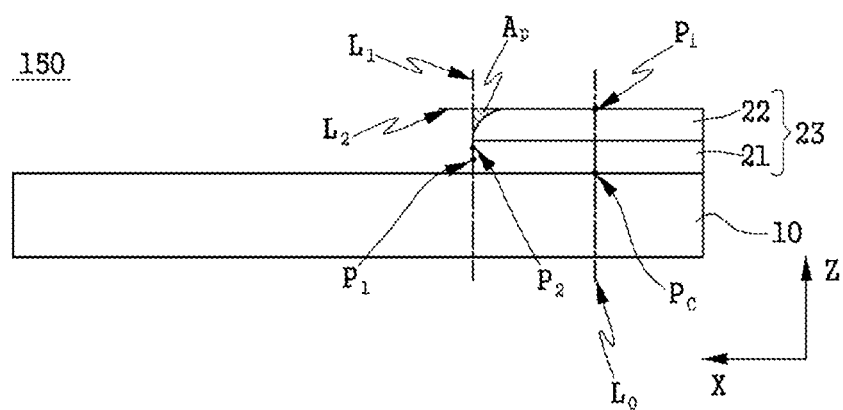
FIG. 4 is a conceptual view for illustrating a method of measuring a pattern edge loss area of a light shielding pattern film formed by patterning a light shielding film according to another embodiment.

FIG. 4 is a conceptual view for illustrating a method of measuring a pattern edge loss area of a light shielding film. Hereinafter, with reference to FIG. 4, an embodiment will be described.

A light shielding film is patterned and thereby a light shielding pattern film 23 is formed.

Subsequently, a blank mask comprising the light shielding pattern film 23 is processed to be a size with a width of 15 mm and a length of 15 mm and thereby a sample is prepared. The surface of the sample is treated by FIB (Focused Ion Beam), after that disposed in a TEM image measuring device, and the TEM image of the sample is measured.

For example, the TEM image may be measured through JEM-2100F HR model available from JEOL LTD corporation.

Thereafter, from a side surface profile of the light shielding pattern film 23 observed in the TEM image, when the entire height of the light shielding pattern film 23 is designated as 100%, a first point ($p_1$) located at a height of 20% on the side surface profile and a second point ($p_2$) located at a height of 40% on the side surface are designated, and an extended line for linking both spots is designated. The extended line is defined as a first lint ($L_1$).

A pattern film crossing point (pi) which is a spot where a pattern film center line ($L_0$) forming an angle perpendicular to an upper boundary of a transparent substrate 10 and the upper surface profile of the light shielding pattern film 23 meet, in addition to passing through a pattern film center point ($p_c$) which is the center point of a lower boundary of the light shielding pattern film 23 observed from the TEM image. An extended line comprising the pattern film crossing point ($p_i$) and disposed to be perpendicular to the upper boundary of the transparent substrate 10. The extended line is defined as a second line ($L_2$).

A pattern edge loss area (Ap) is defined by the area surrounded the first line ($L_1$), the second line ($L_2$), and the pattern edge profile of the light shielding pattern film 23. From the TEM image, a pattern edge loss area of (Ap) is measured.

The pattern edge loss area (Ap) of the light shielding film 20 may be 10 $nm^2$ or less. The pattern edge loss area (Ap) of the light shielding film 20 may be 8 $nm^2$ or less. The pattern edge loss area (Ap) of the light shielding film 20 may be 6 $nm^2$ or less. The pattern edge loss area (Ap) of the light shielding film 20 may be 0.5 $nm^2$ or more. In such a case, a degradation of the resolution can be effectively suppressed.

The Composition and Film Thickness of Light Shielding Film

The light shielding film 20 may comprise a transition metal and at least any one between oxygen and nitrogen.

The light shielding film 20 may comprise a first light shielding layer 21 and a second light shielding layer 22 disposed on the first light shielding layer 21.

The present disclosure controls the amount by element comprised in the second light shielding layer 22, and thereby can help the light shielding film 20 to exhibit desired extinction characteristics, and when the light shielding film 20 is patterned, can allow the side surface profile of the light shielding pattern film 25 to form an angle close to be perpendicular to a surface of the transparent substrate.

The second light shielding layer 22 may comprise a transition metal and at least any one between oxygen and nitrogen. The second light shielding layer 22 may comprise a transition metal in an amount of 50 to 80 at %. The second light shielding layer 22 may comprise a transition metal in an amount of 55 to 75 at %. The second light shielding layer 22 may comprise a transition metal in an amount of 60 to 70 at %.

An amount of oxygen or nitrogen of the second light shielding layer 22 may be 10 to 35 at %. The amount of oxygen or nitrogen of the second light shielding layer 22 may be 15 to 25 at %.

The second light shielding layer 22 may comprise nitrogen in an amount of 5 to 20 at %. The second light shielding layer 22 may comprise nitrogen in an amount of 7 to 13 at %.

In such a case, the second light shielding layer 22 can help the light shielding film 20 to have excellent extinction characteristics. Also, the side surface profile of the light shielding pattern film formed by patterning the light shielding film 20 can be further elaborately controlled.

The first light shielding layer 21 may comprise a transition metal, oxygen, and nitrogen. The first light shielding layer may comprise a transition metal in an amount of 30 to 60 at %. The first light shielding layer 21 may comprise a transition metal in an amount of 35 to 55 at %. The first light shielding layer 21 may comprise a transition metal in an amount of 40 to 50 at %.

The sum of the oxygen amount and the nitrogen amount of the first light shielding layer 22 may be 40 to 70 at %. The sum of the oxygen amount and the nitrogen amount of the first light shielding layer 22 may be 45 to 65 at %. The sum of the oxygen amount and the nitrogen amount of the first light shielding layer 22 may be 50 to 60 at %.

The first light shielding layer 21 may comprise oxygen in an amount of 20 to 40 at %. The first light shielding layer 21 may comprise oxygen in an amount of 23 to 33 at %. The first light shielding layer 21 may comprise oxygen in an amount of 25 to 30 at %.

The first light shielding layer 21 may comprise nitrogen in an amount of 5 to 20 at %. The first light shielding layer 21 may comprise nitrogen in an amount of 7 to 17 at %. The first light shielding layer 21 may comprise nitrogen in an amount of 10 to 15 at %.

In such a case, the first light shielding layer 21 can help the light shielding film 20 to have excellent extinction characteristics and can help the etching rate of the light shielding film 20 to be improved.

The transition metal may comprise at least any one among Cr, Ta, Ti, and Hf. The transition metal may be Cr.

The film thickness of the first light shielding layer 21 may be 250 to 650 Å. The film thickness of the first light shielding layer 21 may be 350 to 600 Å. The film thickness of the first light shielding layer 21 may be 400 to 550 Å. In such a case, the first light shielding layer 21 can help the light shielding film 20 to block an exposure light effectively.

The film thickness of the second light shielding layer 22 may be 30 to 200 Å. The film thickness of the second light shielding layer 22 may be 30 to 100 Å. The film thickness of the second light shielding layer 22 may be 40 to 80 Å. In such a case, the second light shielding layer improves the extinction characteristics of the light shielding film 20 and can help a shape of the side surface of the light shielding pattern film to be further elaborately controlled.

A ratio of the film thickness of the second light shielding layer 22 compared to the film thickness of the first light shielding layer 21 may be 0.05 to 0.3. The film thickness ratio may be 0.07 to 0.25. The film thickness ratio may be 0.1 to 0.2. In such a case, the light shielding film 20 can form a side surface profile close to be perpendicular from the surface of a transparent substrate when patterned, while having sufficient extinction characteristics.

Other Thin Films

Figure 5:
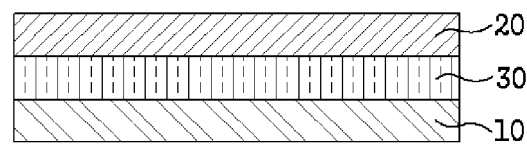
FIG. 5 is a conceptual view for illustrating a blank mask according to another embodiment.

FIG. 5 is a conceptual view for illustrating a blank mask according to another embodiment of the present specification. With reference to the FIG. 5, the blank mask of an embodiment will be described.

A phase shift film 30 may be disposed between a transparent substrate 10 and a light shielding film 20. The phase shift film 30 is a thin film attenuating light transmitting the phase shift film 30, adjusting the phase retardation of the light and substantially suppressing a diffraction light occurring in the edge of a pattern.

The phase shift film 30 may have a phase retardation of 170 to 190° for a light with a wavelength of 193 nm. The phase shift film 30 may have a phase retardation of 175 to 185° for a light with a wavelength of 193 nm. The phase shift film 30 may have a transmittance of 3 to 10% for a light with a wavelength of 193 nm. The phase shift film 30 may have a transmittance of 4 to 8% for a light with a wavelength of 193 nm. In such a case, the resolution of a photomask 200 comprising the phase shift film 30 may be improved.

The phase shift film 30 may comprise a transition metal and silicon. The phase shift film 30 may comprise a transition metal, silicon, oxygen, and nitrogen. The transition metal may be molybdenum.

A descriptions of the transparent substrate 10 and the light shielding film 20 are overlapped with the above description respectively, and thus omitted.

A hard mask (not shown) may be disposed on the light shielding film 20. The hard mask may function as an etching mask film when patterning the light shielding film 20. The hard mask may comprise silicon, nitrogen, and oxygen.

Photomask

Figure 6:
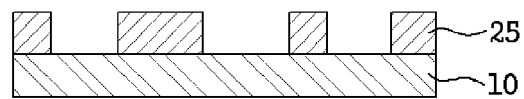
FIG. 6 is a conceptual view for illustrating a photomask according to anther embodiment.

FIG. 6 is a conceptual view for illustrating a photomask according to another embodiment. With reference to the FIG. 6, the photomask of an embodiment will be described.

A photomask 200 according to another embodiment of the present specification comprises a transparent substrate 10 and a light shielding pattern film 25 disposed on the transparent substrate 10.

The light shielding pattern film 25 comprises a transition metal and at least any one between oxygen and nitrogen.

The light shielding pattern film 25 comprises a first light shielding layer 21 and a second light shielding layer 22 disposed on the first light shielding layer 21.

The light shielding pattern film 25 has an Rd value of Equation 1 below which is 0.4 to 0.8.

$$Rd = \frac{er_2}{er_1} \quad \text{[Equation 1]}$$

In the Equation 1, the $er_1$ value is an etching rate of the first light shielding later 21 measured by etching with argon gas.

The $er_2$ value is an etching rate of the second light shielding layer 22 measured by etching with argon gas.

The light shielding pattern film 25 may be formed by patterning the light shielding film 20 of the blank mask 100 described above.

A method of measuring Rd values of the light shielding pattern film 25 is the same as the method of measuring Rd values of the light shielding film 20 in the blank mask 100.

A pattern edge loss area of the light shielding pattern film 25 may be 10 nm² or less.

A method of measuring the pattern edge loss area of the light shielding pattern film 25 is the same as a method of measuring the pattern edge loss area of the light shielding film 20 excepting for skipping a process of patterning the light shielding film 20.

The light shielding pattern film 25 may have a PDo value of Equation 3 below which is less than 0.05.

$$PDo = PBo - PPo \quad \text{[Equation 3]}$$

In the Equation 3, the PBo value is an optical density for a light with a wavelength of 193 nm of the light shielding pattern film 25.

When the light shielding pattern film 25 is observed at the upper surface, the PPo value is an average value of optical density for a light with a wavelength of 193 nm of a measuring area corresponded to an area from an edge of the light shielding pattern film 25 to a position spaced apart by 4 nm in inner side direction of the light shielding pattern film 25.

The edge refers to a portion formed by etching within the edge of the light shielding pattern film 25.

Methods of measuring PDo value, PBo value, and PPo value of the light shielding pattern film 25 is the same as methods of measuring Do value, Bo value, and Po value. However, process of patterning a light shielding film when the PDo value, PBo value, and PPo value of the light shielding pattern film 25 are omitted. Additionally, a surface of a measuring target is applied to the surface of the light shielding pattern film 25 and not applied to the surface of the light shielding film before being patterned.

Descriptions of the properties, composition, and structure of the light shielding pattern film 25 are overlapped with the description of the light shielding film of a blank mask and thus omitted.

Manufacturing Method of Light Shielding Film

A manufacturing method of a blank mask according to one embodiment of the present specification may comprise a preparing operation of installing a transparent substrate, a sputtering target, and a magnet within a sputtering chamber.

A manufacturing method of a blank mask according to one embodiment of the present specification may comprise a film formation operation of injecting an atmosphere gas into a sputtering chamber, controlling the rotation speed of a magnet, supplied an electric power to the sputtering target, and thereby forming a light shielding film on the transparent substrate.

A manufacturing method of a blank mask according to one embodiment of the present specification may comprise a thermal treatment operation of thermally treating for 5 to 30 minutes at 150 to 330° C.

A manufacturing method of a blank mask according to one embodiment of the present specification may comprise a cooling operation of cooling the light shielding film after passing through the thermal treatment operation.

A manufacturing method of a blank mask according to one embodiment of the present specification may comprise a stabilization operation of stabilizing the blank mask after passing through the cooling operation for 1 to 5 minutes at 30 to 50° C.

The film formation operation comprises a first light shielding layer forming process for forming a first light shielding layer on a transparent substrate; and a second light shielding layer forming process for forming a second light shielding layer on the first light shielding layer.

In the preparation operation, when the light shielding film is formed, a target may be selected in consideration of the composition of the light shielding film. As a sputtering target, one target containing a transition metal may be applied. The sputtering targe may be applied by two or more targets comprising one target containing a transition metal. The target containing a transition metal may comprise a transition metal in an amount of 90 at % or more. The target containing a transition metal may comprise a transition metal in an amount of 95 at % or more. The target containing a transition metal may comprise a transition metal of 99 at %.

The transition metal may comprise at least any one among Cr, Ta, Ti, and Hf. The transition metal may comprise Cr.

A description of the transparent substrate disposed in a sputtering chamber is overlapped with the above description and thus omitted.

In the preparation operation, the magnet may be disposed in a sputtering chamber. The magnet may be disposed on a surface opposite to one surface of the sputtering target where sputtering occurs.

In the light shielding film forming operation, the film formation process condition may be applied to be different each other when each layer comprised in the light shielding film is formed into a film. Particularly, in consideration of extinction characteristics and etching characteristics of the light shielding layers, respective process conditions such as a composition of an atmosphere gas, a pressure in a chamber, an electric power supplied to the sputtering target, a rotation speed of the magnet, a time for film formation, a rotation speed of a substrate, and the like.

The atmosphere gas may comprise an inert gas, a reactive gas, and a sputtering gas. The inert gas is a gas comprising an element not composing a thin film to be formed. The reactive gas is a gas comprising an element composing a thin film to be formed. The sputtering gas is a gas which is ionized in plasma atmosphere and collides with a target. The inert gas may comprise helium. The reactive gas may comprise a gas comprising nitrogen.

The gas comprising nitrogen may be for example, $N_2$, NO, $NO_2$, $N_2O$, $N_2O_3$, $N_2O_4$, $N_2O_5$ or the like. The reactive gas may comprise a gas comprising oxygen. The gas comprising oxygen may be for example, $O_2$, $CO_2$ or the like. The reactive gas may comprise a gas comprising nitrogen and a gas comprising oxygen. The reactive gas may comprise a gas comprising both nitrogen and oxygen. The gas comprising both nitrogen and oxygen may be for example, $N_2$, NO, $NO_2$, $N_2O$, $N_2O_3$, $N_2O_4$, $N_2O_5$ or the like.

The sputtering gas may be Ar gas.

The power source supplying an electric power to the sputtering target may be a DC power source, or an RF power source.

In the light shielding film forming operation, the rotation speed of a magnet may be adjusted. The rotation speed of a magnet may affect the plasma distribution area formed within a sputtering chamber. In detail, plasma shows a tendency that the plasma is closer to the sputtering target as the rotation speed of the magnet is faster and is closer to the transparent substrate as the rotation speed of the magnet is slower.

Depending on a position where plasma formed in the sputtering chamber is formed, the density of a thin film to be formed may be different. As plasma is formed nearer to the sputtering target, a number of collisions between argon ions and one surface of the sputtering target is relatively increased, and the thin film has a tendency of being formed more densely. When the rotation speed of a magnet is controlled in consideration such plasma characteristics, densities of the first light shielding layer and second light shielding layer formed in the light shielding film can be relatively easily controlled, respectively.

In the first light shielding layer forming process, the electric power supplied to a sputtering target may be applied to be 1.5 to 2.5 kW. In the first light shielding layer forming process, the electric power supplied to a sputtering target may be applied to be 1.6 to 2 kW.

In the first light shielding layer forming process, a ratio of a flow rate of the reactive gas compared to a flow rate of the inert gas in the atmosphere gas may be 1.5 to 3. The ratio may be 1.8 to 2.7. The ratio may be 2 to 2.5.

The ratio of the oxygen amount compared to the nitrogen amount comprised in the reactive gas may be 1.5 to 4. The ratio of the oxygen amount compared to the nitrogen amount comprised in the reactive gas may be 2 to 3. The ratio of the oxygen amount compared to the nitrogen amount comprised in the reactive gas may be 2.2 to 2.7.

In such a case, the first light shielding layer may help the light shielding film to have sufficient extinction characteristics. Also, an etching characteristics of the first light shielding layer can be controlled and the first light shielding layer can help the side surface of the light shielding film pattern after being patterned to have a shape close to be perpendicular from the surface of the transparent substrate.

In the first light shielding layer forming process, the rotation of a magnet may be applied to be 90 to 140 rpm. In the first light shielding layer forming process, the rotation of a magnet may be applied to be 100 to 120 rpm. In such a case, the etching rate of the first light shielding layer can be improved.

A film formation time for the first light shielding layer may be operated for 200 to 300 seconds. The film formation time for the first light shielding layer may be 210 to 240 seconds. In such a case, the first light shielding layer can help the light shielding film to have sufficient extinction characteristics.

In the second light shielding layer forming process, the electric power supplied to a sputtering target may be applied to be 1 to 2 kW. In the second light shielding layer forming process, the electric power supplied to a sputtering target may be applied to be 1.2 to 1.7 kW. In such a case, the electric power can help the second light shielding layer to have density in a predetermined range.

In the second light shielding layer forming process, a ratio of a flow rate of a reactive gas compared to a flow rate of an inert gas of the atmosphere gas may be 0.3 to 0.8. The ratio may be 0.4 to 0.6.

In the second light shielding layer forming process, the ratio of the oxygen amount compared to the nitrogen amount comprised in the reactive gas may be 0.3 or less. The ratio of the oxygen amount compared to the nitrogen amount comprised in the reactive gas may be 0.1 or less. The ratio of the oxygen amount compared to the nitrogen amount comprised in the reactive gas may be 0.001 or more.

In such a case, a density of a second light shielding layer is controlled, and the side surface of the light shielding pattern film formed by patterning can have a profile to be relatively perpendicular from the surface of the transparent substrate.

In the second light shielding layer forming process, the rotation speed of a magnet can be adjusted. When the rotation speed of a magnet is controlled only in consideration of the view of suppressing excessive etching which may occur in the side surface of the second light shielding layer within the light shielding pattern film during the patterning of the light shielding film, sputtering particles occurring from the sputtering target is not deposited on the surface of a target for film formation and may be redeposited on the surface of the sputtering target. The redeposited sputtering particles may function as a particle source and may induce the degradation of the resolution of a blank mask. The present disclosure controls the rotation speed of a magnet within a predetermined range in the second light shielding layer forming process, thereby can elaborately control a shape of the side surface profile of the light shielding pattern film and can effectively suppress the particle formation.

In the second light shielding layer forming process, the rotation speed of a magnet may be applied to be 100 to 150 rpm. In the second light shielding layer forming process, the rotation speed of a magnet may be applied to be 110 to 140 rpm. In such a case, when the light shielding film is patterned, the side profile of the light shielding pattern film can be elaborately controlled, and the degradation of the resolution of a pattern caused from particles can be suppressed.

The film formation time of the second light shielding layer may be operated for 10 to 30 seconds. The film formation time of the second light shielding layer may be operated for 15 to 25 seconds. In such a case, the second light shielding layer can help the side surface of the patterned light shielding film to form an angle close to be perpendicular to the surface of the transparent substrate.

In the thermal treatment operation, the light shielding film after the film formation operation may be treated with heat. In detail, the substrate after forming the light shielding film is disposed in a thermal treatment chamber, and after that, the thermal treatment may be performed.

In the thermal treatment operation, the atmosphere temperature may be 150 to 300° C. The atmosphere temperature may be 170 to 280° C. The atmosphere temperature may be 200 to 250° C.

In the thermal treatment operation, the thermal treatment time may be 5 to 25 minutes. The thermal treatment time may be 10 to 20 minutes. In such a case, the internal stress formed in the light shielding film can be effectively decreased.

A cooling operation may be applied within 2 minutes after completing the thermal treatment operation. In such a case, growth of particles of a transition metal comprised in the light shielding film, caused from heating, can be suppressed.

In the cooling operation, the light shielding film can be cooled by using a cooling plate. In detail, a cooling plate adjusted to a predetermined cooling temperature is disposed at the side of the transparent substrate of the blank mask after the thermal treatment operation to cool the blank mask. In the cooling operation, a space between the blank mask and the cooling plate may be adjusted to control the cooling speed of the blank mask.

In the cooling operation, the cooling temperature applied to the cooling plate may be 10 to 40° C. The cooling temperature may be 20 to 30° C.

The cooling operation may be performed for 5 to 20 minutes. The cooling operation may be 10 to 15 minutes.

In the cooling operation, the distance between the blank mask and the cooling plate may be 0.01 to 30 mm. The distance may be 0.05 to 5 mm. The distance may be 0.1 to 2 mm.

In the cooling operation, the cooling speed of the blank mask may be 0.45 to 1° C./s. The cooling speed may be 0.5 to 0.8° C./s.

In such a case, damage of the light shielding film caused from cooling can be substantially suppressed, and degradation of durability of respective layers within the light shielding film, caused from the growth of particles of a transition metal comprised in the light shielding film after thermal treatment can be effectively suppressed.

In the stabilizing operation, the blank mask after the cooling operation may be stabilized. In the case of a blank mask after the cooling operation, considerable damage can be added to the blank mask because of rapid change of temperature. For preventing this, a stabilizing operation may be required.

The method for stabilizing the blank mask after the cooling operation may be various. As one example, the blank mask after the cooling operation is detached from the cooling plate and after that may be leaved for a certain time in the atmosphere of room temperature. As another example, the blank mask after the cooling operation is detached from the cooling plate and stabilized for 1 to 5 minutes at 30 to 50° C. In this time, the blank mask may be rotated for 1 to 5 minutes at 20 to 50 rpm. As another example, a gas, which does not react with a blank mask, may be injected for 1 to 5 minutes in the flow rate of 5 to 10 L/min to the blank mask after the cooling operation. In this time, the gas which does not react with a blank mask may have a temperature of 20 to 40° C.

Manufacturing Method of Semiconductor Element

A manufacturing method of a semiconductor element comprises a preparation operation of disposing a light source, a photomask, and a semiconductor wafer where a resist film have been applied, an exposure operation of selectively transmitting a light incident from the light source on the semiconductor wafer through the photomask, and a development operation of developing a pattern on the semiconductor wafer.

The photomask comprises a transparent substrate and a light shielding pattern film disposed on the transparent substrate.

The light shielding pattern film comprise a transition metal, and at least any one between oxygen and nitrogen.

The light shielding pattern film comprises a first light shielding film and a second light shielding film disposed on the first light shielding film.

The light shielding pattern film has an Rd value of Equation 1 below which is 0.4 to 0.8.

$$Rd = \frac{er_2}{er_1} \quad \text{[Equation 1]}$$

In the Equation 1, the $er_1$ value is an etching rate of the first light shielding layer measured by etching with argon gas.

The $er_2$ value is an etching rate of the second light shielding layer measured by etching with argon gas.

In the preparing operation, the light source is a device which can generate an exposure light with a short wavelength. The exposure light may be a light with a wavelength of 200 nm or less. The exposure light may be an ArF light with a wavelength of 193 nm.

A lens may be additionally disposed between a photomask and a semiconductor wafer. The lens has a function of miniaturing the shape of a circuit pattern of the photomask and transferring it on the semiconductor wafer. The lens is not limited if it can be ordinarily applied to an exposure process of ArF semiconductor wafer. For example, the lens may be applied by a lens composed of calcium fluoride ($CaF_2$).

In the exposure operation, an exposure light can be transmitted on the semiconductor wafer through a photomask. In such a case, chemical transformation may occur in a portion where the exposure light is incident within the resist film.

In the development operation, a pattern may be developed on the semiconductor wafer by treating the semiconductor wafer after the exposure operation with a developing solution. When the applied resist film is a positive resist, the portion where an exposure light is incident within the resist film may be dissolved by a developing solution. When the applied resist film is a negative resist, the portion where an exposure light is not incident may be dissolved by a developing solution. The resist film is formed into a resist pattern by the developing solution treatment. A pattern may be formed on the semiconductor wafer by taking the resist pattern as a mask.

The description of a photomask is overlapped with the above description and thus omitted.

Hereinafter, further detailed description of specific example embodiments will be made.

Manufacture Example: Formation of Light Shielding Film

Example 1: A transparent substrate of quartz material with a width of 6 inches, a length of 6 inches, and a thickness of 0.25 inches was disposed in a chamber of a DC sputtering device. A chrome target was disposed in the chamber to form a T/S distance of 255 mm and an angle of 25 degrees between the substrate and the target. A magnet was installed on the rear of the chrome target.

Thereafter, an atmosphere gas in which Ar of 21 volume %, $N_2$ of 11 volume %, $CO_2$ of 32 volume %, and He of 36 volume % had been mixed was introduced in the chamber, electric power supplied to the sputtering target was applied to be 1.85 kW, rotation speed of the magnet was applied to be 113 rpm, and a sputtering process was performed for 250 seconds, thereby forming a first light shielding layer.

After the formation of the first light shielding layer, an atmosphere gas in which Ar of 57 volume % and $N_2$ of 43 volume % had been mixed was introduced in the chamber, electric power supplied to a sputtering target was applied to be 1.5 kW, rotation speed of a magnet was applied to be 113 rpm, a sputtering process was performed for 25 seconds, and a blank mask sample in which a second light shielding layer had been formed was manufactured.

The sample after the formation of the second light shielding layer was disposed in a thermal treatment chamber. Thereafter, atmosphere temperature was applied to be 250° C. and thermal treatment was performed for 15 minutes. The blank mask after thermal treatment was taken out from the thermal treatment and rotated for 2 minutes at the atmosphere of 40° C. at 30 rpm.

A cooling plate to which a cooling temperature had been applied to be 10 to 40° C. was installed on the side of the transparent substrate of the blank mask. The distance between the transparent substrate of the blank mask and the cooling plate was applied to be 0.1 mm. The cooling operation was performed for 5 to 20 minutes.

Example 2: A blank mask sample was manufactured under the same condition as Example 1. However, a gas in which Ar of 19 volume %, $N_2$ of 11 volume %, $CO_2$ of 36 volume %, and He of 34 volume % had been mixed was applied as the atmosphere when the first light shielding layer was formed.

Example 3: A blank mask sample was manufactured under the same condition as Example 1. However, a gas in which Ar of 17 volume %, $N_2$ of 24 volume %, $CO_2$ of 29 volume %, and He of 30 volume % had been mixed was applied as the atmosphere when the first light shielding layer was formed. Additionally, the distance between the substrate surface of the blank mask and the cooling plate was applied to be 2 mm when the blank mask sample was cooled.

Example 4: A blank mask sample was manufactured under the same condition as Example 2. However, the rotation speed of a magnet was applied to be 127 rpm when a second light shielding layer was formed. Additionally, the distance between the substrate of the blank mask and the cooling plate was applied to be 2 mm when the blank mask sample was cooled.

Example 5: A blank mask sample was manufactured under the same condition as Example 4. However, the rotation speed of a magnet was applied to be 131 rpm when a first light shielding layer was formed.

Example 6: A blank mask sample was manufactured under the same condition as Example 2. However, the distance between the substrate surface of the blank mask and the cooling plate was applied to be 5 mm when the blank mask sample was cooled.

Comparative Example 1: A blank mask sample was manufactured under the same condition as Example 1. However, an atmosphere gas with Ar of 44 volume %, $N_2$ of 56 volume % when the second light shielding layer was formed.

Comparative Example 2: A blank mask sample was manufactured under the same condition as Example 2. However, the rotation speed of a magnet was applied to be 89 rpm when the second light shielding layer was formed.

Comparative Example 3: A blank mask sample was manufactured under the same condition of Example 2. However, when the blank mask sample was cooled, the distance between the substrate surface of the blank mask and the cooling plate was applied to be 10 mm.

Comparative Example 4: A blank mask sample was manufactured under the same condition of Example 2. However, when the blank mask sample was cooled, the distance between the substrate surface of the blank mask and the cooling plate was applied to be 20 mm.

The conditions for the film formation, thermal treatment, and cooling of respective Examples and Comparative Examples were described in Table 1 below.

Evaluation Example: Measurement of Rd Value of Light Shielding Film

Samples by Examples and Comparative Examples were processed to be the size of 15 mm vertically and horizontally. The surfaces of the processed samples were treated by FIB (Focussed Ion Beam), after that disposed in an apparatus of JEM-2100F HR model available from JEOL LTD corporation, and TEM images of the samples were measured. The thicknesses of the first light shielding layer and the second light shielding layer were measured from the TEM images.

Thereafter, the samples were etched with argon gas and the etching times of the first light shielding layer and the second light shielding layer were measured. The samples were disposed in K-Alpha model available from Thermo Scientific corporation, the area with a width of 4 mm and a length of 2 mm placed in the center of each sample was etched with argon gas, and the etching time of each layer was measured. When the etching time of each layer was measured, the vacuum degree of $1.0*10^{-8}$ mbar, X-ray source of Monochromator Al Kα (1486.6 eV), anode electric power of 72 W, anode voltage of 12 kV, and the voltage of argon ion beam of 1 kV were applied.

The $er_1$ value, $er_2$ value, and Rd value were calculated from the measured thicknesses and etching speeds of the first light shielding layer and the second light shielding layer. The $er_1$ value, $er_2$ value, and Rd value by Examples and Comparative Examples were described in Table 2 below.

Evaluation Example: Measurement of Optical Properties of Light Shielding Film

The Bo value as an optical density and transmittance for an exposure light with a wavelength of 193 nm were measured from the surface of the light shielding film of the sample of each Example or Comparative Example by using MG-pro model available from Nano-View.

Subsequently, a light shielding pattern film was formed by patterning the light shielding film. The Po value was measured through an exposure light with a wavelength of 193 nm by using MG-Pro model available from Nano-View, in a measuring area corresponded to an area from an edge formed by patterning, to a position spaced apart by 4 nm in the inner direction of the light shielding pattern film, when the light shielding pattern film was observed at the upper surface.

The Do value was calculated from the Bo value and Po value.

The Do value, Bo value, Po value, and transmittance for a light with a wavelength of 193 nm measured by Examples and Comparative Examples were described in Table 2 below.

Evaluation Example: Measurement of Etching Characteristics of Light Shielding Film A TEM image of the light shielding film comprised in a sample of each Example or Comparative Example was taken to measure a thickness of the light shielding film. The sample was processed to be the size of 15 mm vertically and horizontally. A surface of the processed sample was treated by FIB (Focussed Ion Beam), after that disposed in an apparatus of JEM-2100F HR model available from JEOL LTD. Subsequently, TEM image of the sample was taken. The thickness of the light shielding film was measured from the TEM image.

Thereafter, etching time of the light shielding film measured by etching with a chlorine-base gas was measured. As the chlorine-based gas, a gas comprising a chlorine gas of 90 to 95 volume % and an oxygen gas of 5 to 10 volume % was applied. The etching rate of the light shielding film measured by etching the chlorine-based gas was calculated from the thickness of the light shielding film and the etching time of the light shielding film.

The measured values of etching rates by Examples and Comparative Examples were described in Table 2 below.

Evaluation Example: Measurement of Pattern Edge Loss Area of Light Shielding Film A light shielding pattern film was formed by patterning the light shielding film of each Example or Comparative Example. Thereafter, the substrate comprising the light shielding pattern film was processed to be the size of 15 mm vertically and horizontally. The surface of the sample was treated by FIB (Focussed Ion Beam), after that disposed in an apparatus of JEM-2100F HR model available from JEOL LTD, and measured for the TEM image of the sample.

Thereafter, in a side surface profile of the light shielding pattern film observed from the TEM image, when an entire height of the light shielding pattern film was designated as 100%, the spot placed at the height of 20% on the side surface profile and the spot placed at the height of 40% on the side surface profile were designated, and a first line which was an extended line for linking both spots was designated.

A crossing point of a line passing through a center of the light shielding pattern film and an upper surface profile of the light shielding pattern film observed from the TEM image was designated, and a second line comprising the crossing point and disposed to be parallel to an upper boundary transparent substrate was designated.

A pattern edge loss area which was an area surrounded the first line, the second line, and a profile of the light shielding pattern film was measured from the TEM image.

The pattern edge loss areas measured by Examples and Comparative Examples were described in Table 2 below.

TABLE 1

| | Type of Light shielding Layer | Film Formation Time (s) | Rotation Speed of Magnet (rpm) | The Amount by Gases in Atmosphere Gas (volume %) | | | | Distance between Substrate Surface (mm) | Cooling Rate (° C./s) |
|---|---|---|---|---|---|---|---|---|---|
| | | | | Ar | $N_2$ | $CO_2$ | He | | |
| Example 1 | First Light shielding Layer | 250 | 113 | 21 | 11 | 32 | 36 | 0.1 | 0.6 |
| | Second Light shielding Layer | 25 | 113 | 57 | 43 | 0 | 0 | | |
| Example 2 | First Light shielding Layer | 250 | 113 | 19 | 11 | 36 | 34 | 0.1 | 0.6 |

TABLE 1-continued

|  | Type of Light shielding Layer | Film Formation Time (s) | Rotation Speed of Magnet (rpm) | The Amount by Gases in Atmosphere Gas (volume %) | | | | Distance between Substrate Surface (mm) | Cooling Rate (° C./s) |
| --- | --- | --- | --- | --- | --- | --- | --- | --- | --- |
|  |  |  |  | Ar | N$_2$ | CO$_2$ | He |  |  |
|  | Second Light shielding Layer | 25 | 113 | 57 | 43 | 0 | 0 |  |  |
| Example 3 | First Light shielding Layer | 250 | 113 | 17 | 24 | 29 | 30 | 2 | 0.6 |
|  | Second Light shielding Layer | 25 | 113 | 57 | 43 | 0 | 0 |  |  |
| Example 4 | First Light shielding Layer | 250 | 113 | 19 | 11 | 36 | 34 | 2 | 0.6 |
|  | Second Light shielding Layer | 25 | 127 | 57 | 43 | 0 | 0 |  |  |
| Example 5 | First Light shielding Layer | 250 | 113 | 19 | 11 | 36 | 34 | 2 | 0.6 |
|  | Second Light shielding Layer | 25 | 131 | 57 | 43 | 0 | 0 |  |  |
| Example 6 | First Light shielding Layer | 250 | 113 | 19 | 11 | 36 | 34 | 5 | 0.5 |
|  | Second Light shielding Layer | 25 | 113 | 57 | 43 | 0 | 0 |  |  |
| Comparative Example 1 | First Light shielding Layer | 250 | 113 | 21 | 11 | 32 | 36 | 0.1 | 0.6 |
|  | Second Light shielding Layer | 25 | 113 | 44 | 56 | 0 | 0 |  |  |
| Comparative Example 2 | First Light shielding Layer | 250 | 113 | 19 | 11 | 36 | 34 | 0.1 | 0.6 |
|  | Second Light shielding Layer | 25 | 89 | 57 | 43 | 0 | 0 |  |  |
| Comparative Example 3 | First Light shielding Layer | 250 | 113 | 19 | 11 | 36 | 34 | 10 | 0.4 |
|  | Second Light shielding Layer | 25 | 113 | 57 | 43 | 0 | 0 |  |  |
| Comparative Example 4 | First Light shielding Layer | 250 | 113 | 19 | 11 | 36 | 34 | 20 | 0.2 |
|  | Second Light shielding Layer | 25 | 113 | 57 | 43 | 0 | 0 |  |  |

TABLE 2

|  | Rd | $er_2$ (Å/s) | $er_1$ (Å/s) | Do | Bo | Po | Transmittance (%) | Etching Rate (Å/s) | Loss Area of Pattern Edge (nm²) |
|---|---|---|---|---|---|---|---|---|---|
| Example 1 | 0.767 | 0.427 | 0.557 | 0.04 | 1.88 | 1.84 | 1.318 | 1.7 | 7.932 |
| Example 2 | 0.692 | 0.430 | 0.621 | 0.03 | 1.85 | 1.82 | 1.412 | 1.7 | 6.680 |
| Example 3 | 0.650 | 0.430 | 0.661 | 0.02 | 1.82 | 1.80 | 1.526 | 1.7 | 5.967 |
| Example 4 | 0.662 | 0.411 | 0.621 | 0.03 | 1.86 | 1.83 | 1.378 | 1.6 | 6.162 |
| Example 5 | 0.650 | 0.404 | 0.622 | 0.03 | 1.87 | 1.84 | 1.356 | 1.6 | 5.957 |
| Example 6 | 0.694 | 0.430 | 0.620 | 0.03 | 1.85 | 1.82 | 1.411 | 1.7 | 7.566 |
| Comparative Example 1 | 1.085 | 0.602 | 0.555 | 0.09 | 1.85 | 1.76 | 1.413 | 1.7 | 13.318 |
| Comparative Example 2 | 0.829 | 0.518 | 0.625 | 0.05 | 1.77 | 1.72 | 1.712 | 1.7 | 8.988 |
| Comparative Example 3 | 0.695 | 0.432 | 0.622 | 0.07 | 1.85 | 1.78 | 1.416 | 1.7 | 10.953 |
| Comparative Example 4 | 0.700 | 0.433 | 0.619 | 0.08 | 1.85 | 1.77 | 1.412 | 1.8 | 12.465 |

In the Table 2, while Rd values of Examples 1 to 6 were shown as a value of 0.4 to 0.8, Rd values of Comparative Examples 1 and 2 were shown as a value of less than 0.4 or more than 0.8.

For Do value, while Examples 1 to 6 showed a value of less than 0.05, all the Comparative Examples showed a value of 0.05 or more.

For transmittance, while Examples 1 to 6 showed a value of 1.55% or less, Comparative Example 2 showed a value of 1.7% or more.

For etching rate, All the Example and Comparative Examples showed a value of 1.6 Å/s or more.

For a pattern edge loss area, while Examples 1 to 6 showed a value of 8 nm² or less, all the Comparative Examples showed a value of 8.5 nm² or more.

Although the exemplary embodiments have been described in detail, the scope of the present invention is not limited thereto, and modifications and alterations made by those skilled in the art using the basic concept of the present invention defined in the following claims fall within the scope of the present invention.

What is claimed is:

1. A blank mask comprising:
a transparent substrate and a light shielding film disposed on the transparent substrate,
wherein the light shielding film comprises a transition metal and at least any one between oxygen and nitrogen,
wherein the light shielding film comprises a first light shielding layer and a second light shielding layer disposed on the first light shielding layer, and
wherein the light shielding film has an Rd value of Equation 1 below which is 0.4 to 0.8;

$$Rd = \frac{er_2}{er_1} \quad \text{[Equation 1]}$$

where in the Equation 1, the $er_1$ value is an etching rate of the first light shielding layer measured by etching with argon gas, and
the $er_2$ value is an etching rate of the second light shielding layer measured by etching with argon gas.

2. The blank mask of claim 1,
wherein the $er_2$ value is 0.4 to 0.5 Å/s.

3. The blank mask of claim 1,
wherein the $er_1$ value is 0.51 Å/s or more.

4. The blank mask of claim 1,
wherein the Do value of Equation 2 below of the light shielding film is less than 0.05;

$$Do=Bo-Po \quad \text{[Equation 2]}$$

where in the Equation 2, the Bo value is an optical density of the light shielding film for a light with a wavelength of 193 nm, and
when a light shielding pattern film formed by patterning the light shielding film is observed at an upper surface, the Po value is an optical density for a light with a wavelength of 193 nm of a measuring area corresponded to an area from an edge of the light shielding pattern film, to a position spaced apart by 4 mm from the edge in inner side direction of the light shielding pattern film.

5. The blank mask of claim 1,
wherein the transition metal comprises any one among Cr, Ta, Ti and Hf.

6. The blank mask of claim 1,
wherein an etching rate measured with chlorine-based gas of the light shielding film is 1.55 Å/s or more.

7. A blank mask comprising:
a transparent substrate and a light shielding film disposed on the transparent substrate,
wherein the light shielding film comprises a transition metal and at least any one between oxygen and nitrogen,
wherein the light shielding film comprises a first light shielding layer and a second light shielding layer disposed on the first light shielding layer, and
a pattern edge loss area measured from patterning the light shielding film is 10 nm² or less;
wherein the pattern edge loss area is an area surrounded a first line, a second line, and a pattern edge profile of patterned light shielding film when TEM (Transmission Electron Microscopy) image of the patterned light shielding film is observed,
wherein the first line is an extended line which links a first point placed at a height of 20% on a side surface profile of the patterned light shielding film and a second point placed at a height of 40% on the side surface profile when an entire height of the patterned light shielding film is designated as 100%, wherein the second line is an extended line comprising a pattern film crossing point and disposed to be parallel to an upper boundary of the transparent substrate, wherein the pattern film crossing point is a spot where a pattern film center line and an upper surface profile of the patterned light shielding film meet, wherein the pattern film center line is an extended line passing through a pattern film center point which is a center point of a lower boundary of the patterned light shielding film, and perpendicular to the upper boundary of the transparent substrate.

8. A photomask comprising a transparent substrate and a light shielding pattern film disposed on the transparent substrate, wherein the light shielding pattern film comprises a transition metal and at least any one between oxygen and nitrogen, wherein the light shielding pattern film comprises a first light shielding layer and a second light shielding layer disposed on the first light shielding layer, and wherein the light shielding pattern film has an Rd value of Equation 1 below which is 0.4 to 0.8;

$$Rd = \frac{er_2}{er_1} \qquad \text{[Equation 1]}$$

where in the Equation 1, the $er_1$ value is an etching rate of the first light shielding layer measured by etching with argon gas, and the $er_2$ value is an etching rate of the second light shielding layer measured by etching with argon gas.

9. The photomask of claim 8, wherein a pattern edge loss area of the light shielding pattern film is 10 $nm^2$ or less when the light shielding pattern film is observed at the section.

* * * * *